(12) United States Patent
Liu et al.

(10) Patent No.: US 10,497,813 B2
(45) Date of Patent: Dec. 3, 2019

(54) ARRAY SUBSTRATE AND PREPARATION METHOD THEREOF, DISPLAY PANEL AND DISPLAY DEVICE

(71) Applicants: BOE Technology Group Co., Ltd., Beijing (CN); Hefei Xinsheng Optoelectronics Technology Co., Ltd, Hefei (CN)

(72) Inventors: Jun Liu, Beijing (CN); Wei Li, Beijing (CN); Bin Zhou, Beijing (CN); Tongshang Su, Beijing (CN); Jingang Fang, Beijing (CN); Yang Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/991,535

(22) Filed: May 29, 2018

(65) Prior Publication Data
US 2019/0043996 A1  Feb. 7, 2019

(30) Foreign Application Priority Data

Aug. 4, 2017  (CN) .......................... 2017 1 0662048

(51) Int. Cl.
*H04L 29/08* (2006.01)
*H01L 29/786* (2006.01)
(Continued)

(52) U.S. Cl.
CPC ..... *H01L 29/78633* (2013.01); *G09G 3/3225* (2013.01); *H01L 27/1225* (2013.01);
(Continued)

(58) Field of Classification Search
CPC ............. H01L 29/786; H01L 29/78633; H01L 29/7869; H01L 27/1225; H01L 27/1259
See application file for complete search history.

(56) References Cited

U.S. PATENT DOCUMENTS 6,265,249 B1 * 7/2001 Wu .................... H01L 29/66765
257/57
2017/0052405 A1 * 2/2017 Yu ........................ H05K 999/99
(Continued)

*Primary Examiner* — Phuc T Dang
(74) *Attorney, Agent, or Firm* — Fay Sharpe LLP

(57) ABSTRACT

An array substrate, preparation method thereof, display panel and display device are provided. The array substrate includes a base substrate and a plurality of thin film transistors distributed on the base substrate in an array. Each thin film transistor includes: a light-shielding block formed on the base substrate and provided with a first groove of which an opening direction is away from the base substrate; a buffer layer formed on one side of the light-shielding block away from the base substrate, a region of the buffer layer corresponding to the first groove being disposed with a second groove of which an opening direction is away from the base substrate; and a channel layer formed in the second groove. The structure uses bulges on two sides of the first groove to shield the light rays in regions without the thin film transistor, thereby improving the stability of the thin film transistor.

20 Claims, 10 Drawing Sheets

(51) Int. Cl.
*G09G 3/3225* (2016.01)
*H01L 27/12* (2006.01)
*H01L 29/417* (2006.01)

(52) U.S. Cl.
CPC .... *H01L 27/1259* (2013.01); *H01L 29/41733* (2013.01); *H01L 29/7869* (2013.01); *H01L 29/78696* (2013.01)

(56) References Cited

U.S. PATENT DOCUMENTS

2017/0186783 A1* 6/2017 Hu ...................... H01L 27/1281
2018/0374884 A1* 12/2018 Cheng ............... H01L 27/14621

* cited by examiner

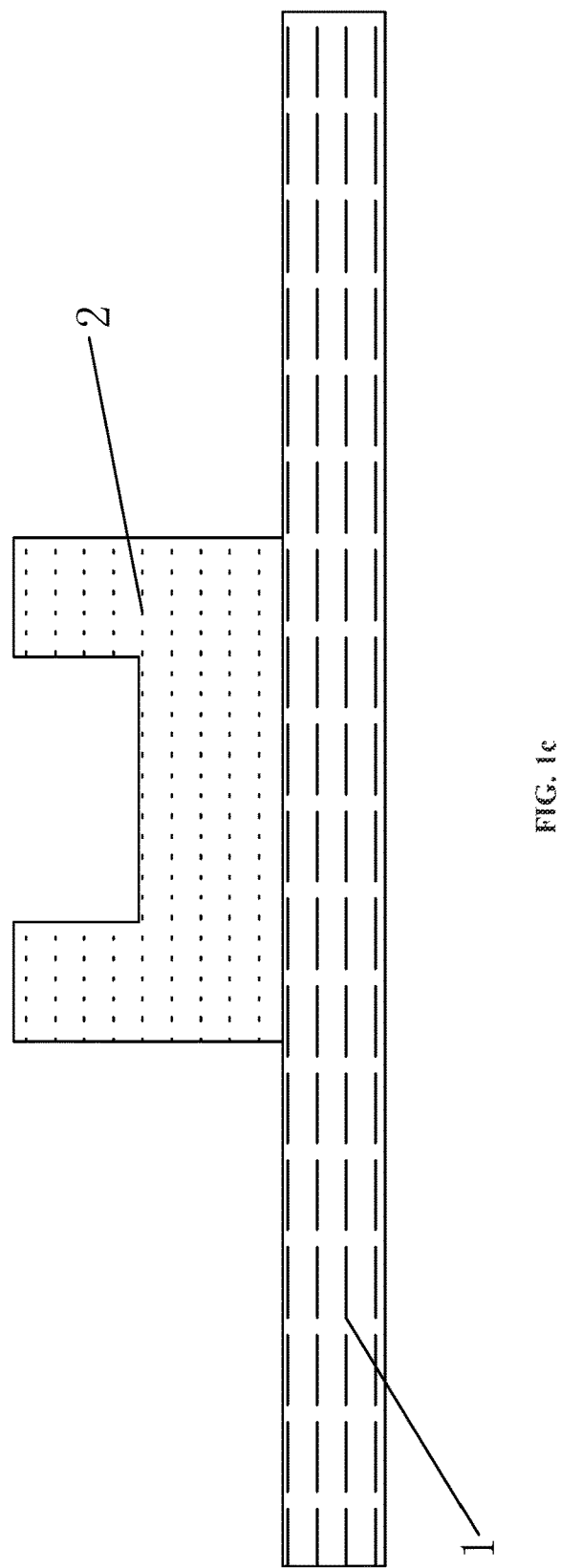

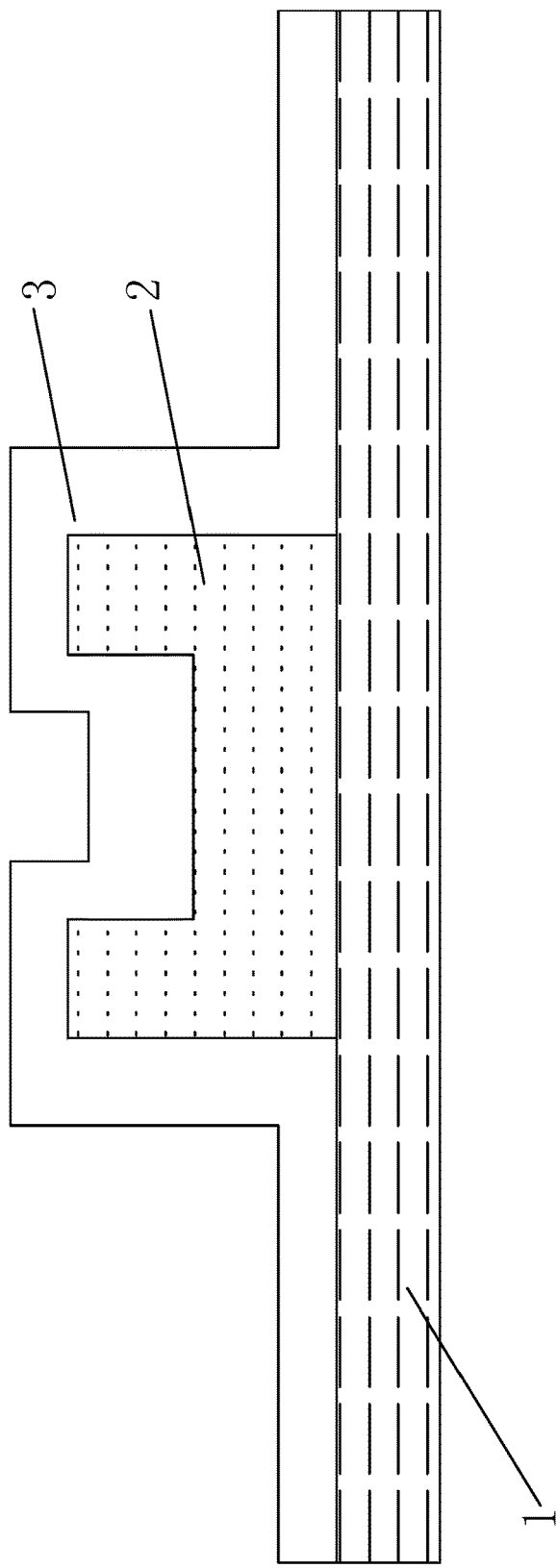

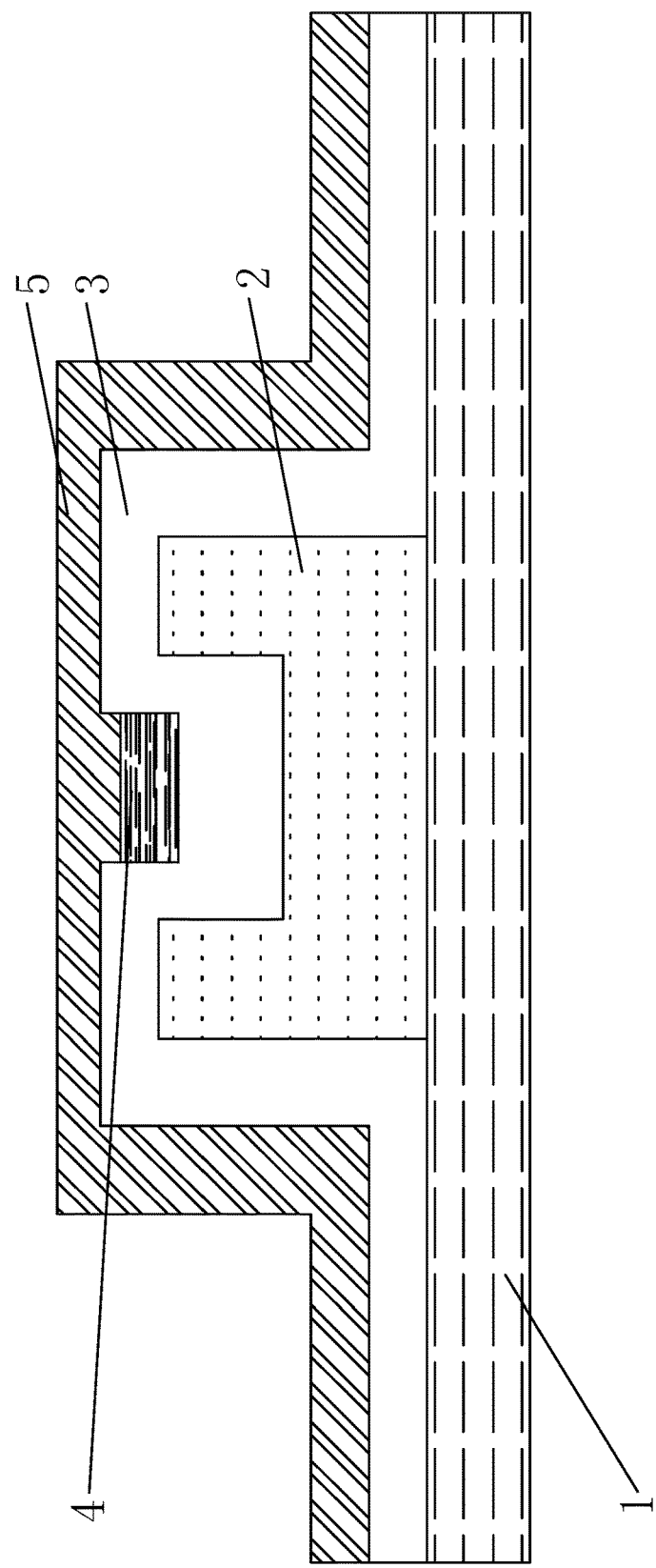

ARRAY SUBSTRATE AND PREPARATION METHOD THEREOF, DISPLAY PANEL AND DISPLAY DEVICE

CROSS-REFERENCE TO RELATED APPLICATION

The present application claims priority to Chinese Patent Application No. 201710662048.2 filed with the State Intellectual Property Office of the P. R. C. on August 4, 2017 and titled "Array Substrate and Preparation Method Thereof", which is incorporated herein by reference in its entirety.

TECHNICAL FIELD

The present disclosure relates to an array substrate and a preparation method thereof, a display panel and a display device.

BACKGROUND

In recent years, organic light-emitting diode (OLED) display panels gradually become a mainstream in display panels due to their advantages of high contrast, self illumination and the like, and are very popular.

In a large-sized OLED display panel, in order to protect the stability of the channel layer in the thin film transistor (TFT), a layer of metal pattern is formed under the top-gate thin film transistor to avoid the interference of external light on the characteristics of the thin film transistor. However, since the metal pattern and the channel layer are separated by a buffer layer, and metal wires in the large-sized OLED display panel are very dense, the light reflected by other metal regions cannot be blocked, and thus the stability of the thin film transistor is reduced.

SUMMARY

The present disclosure provides an array substrate and a preparation method thereof, a display panel and a display device.

In a first aspect of the present disclosure, there is provided an array substrate. The array substrate comprises a base substrate and a plurality of thin film transistors distributed on the base substrate in an array, wherein each of the thin film transistors comprises: a light-shielding block formed on the base substrate and provided with a first groove of which an opening direction is away from the base substrate; a buffer layer formed on one side of the light-shielding block away from the base substrate, a region of the buffer layer corresponding to the first groove being disposed with a second groove of which an opening direction is away from the base substrate; and a channel layer formed in the second groove.

In some embodiments, the light-shielding block is made of a nonmetal material.

In some embodiments, a preparation material for the light-shielding block is a black matrix material.

In some embodiments, preparation materials for the array substrate meet at least one of the following: the preparation material for the buffer layer is silicon oxide; and the preparation material for the channel layer is an In—Ga—Zn oxide.

In some embodiments, the array substrate further comprises: a gate insulating layer formed on one side of the channel layer away from the base substrate; a gate electrode formed on one side of the gate insulating layer away from the base substrate; an interlayer insulating layer formed on one side of the gate electrode away from the base substrate; a source-drain electrode formed on one side of the interlayer insulating layer away from the base substrate, the source-drain electrode being connected to the channel layer by via holes; and a passivation layer formed on one side of the source-drain electrode away from the base substrate.

In some embodiments, preparation materials for the array substrate meet at least one of the following: the preparation material for the gate insulating layer is silicon oxide; the preparation material for the gate electrode is Cu or Al; the preparation material for the interlayer insulating layer is silicon oxide; the preparation material for the source-drain electrode is Cu or Al; and the preparation material for the passivation layer is silicon oxide.

In some embodiments, a depth of the first groove is 0.5-0.7 micrometer, a thickness of the buffer layer is 0.3-0.5 micrometer, a thickness of the channel layer is 0.05-0.09 micrometer; and along an extending direction of the base substrate, a width of the first groove is larger than that of the channel layer by 3-5 micrometer.

In some embodiments, a thickness of the gate insulating layer is 0.1-0.2 micrometer; a thickness of the gate electrode is 0.5-0.7 micrometer; a thickness of the interlayer insulating layer is 0.3-0.5 micrometer; and a thickness of the source-drain electrode is 0.5-0.7 micrometer.

In some embodiments, a preparation material for the light-shielding block is a metal material.

In a second aspect of the present disclosure, there is provided a preparation method for an array substrate, used to prepare the array substrate described in the first aspect. The preparation method comprises: forming a light-shielding block pattern on a base substrate, a light-shielding block in the light-shielding block pattern being disposed with a first groove of which an opening direction is away from the base substrate; forming a buffer layer on the light-shielding block pattern, wherein the buffer layer has a second groove corresponding to the first groove; and forming a channel layer coating on the buffer layer, and forming a channel layer pattern by a single patterning process, the channel layer pattern being in the second groove.

In some embodiments, the light-shielding block is formed by light-shielding photoresist, and forming the light-shielding block pattern on the base substrate comprises: forming the light-shielding block pattern on the base substrate by a gray scale mask process.

In some embodiments, after forming the channel layer coating on the buffer layer, the preparation method further comprises: forming a gate insulating layer on the channel layer pattern, and forming a gate metal layer on the gate insulating layer, and forming a gate pattern and a gate insulating layer pattern by a patterning process, the gate insulating layer pattern covering a part of the channel layer pattern; forming an interlayer insulating layer on the gate pattern, and forming via holes in the interlayer insulating layer by a via hole etching process; forming a source-drain electrode metal layer on the interlayer insulating layer, and forming a source-drain electrode pattern by the patterning process, the source-drain electrode pattern being electrically connected to the channel layer pattern through the via holes; and forming a passivation layer on the source-drain electrode pattern.

In some embodiments, the patterning process adopted for the gate metal layer and the gate insulating layer comprises: forming gate mask photoresist on the gate metal layer; performing wet etching on the gate metal layer with the gate mask photoresist as a mask, to form the gate pattern;

reserving the gate mask photoresist to perform dry etching on the gate insulating layer, to form the gate insulating layer pattern; and peeling off the gate mask photoresist by a peeling process.

In some embodiments, the peeling process comprises a wet peeling method for peeling.

In some embodiments, the via hole etching process comprises dry etching for etching.

In some embodiments, a preparation material for the light-shielding block is a metal material, and forming the light-shielding block pattern on the base substrate comprises: forming the light-shielding block pattern on the base substrate by a patterning process.

In a third aspect of the present disclosure, there is provided a display panel which comprises: a base substrate and a plurality of thin film transistors distributed on the base substrate in an array, wherein each of the thin film transistors comprises: a light-shielding block formed on the base substrate, the light-shielding block being disposed with a first groove of which an opening direction is away from the base substrate; a buffer layer formed on one side of the light-shielding, block away from the base substrate, a region of the buffer layer corresponding to the first groove being disposed with a second groove of which an opening direction is away from the base substrate; and a channel layer formed in the second groove.

In some embodiments, the display panel is an organic electroluminescence diode display panel.

In a fourth aspect of the present disclosure, there is provided display device, comprising the display panel described in the third aspect.

BRIEF DESCRIPTION OF THE DRAWINGS

FIG. 1a to FIG. 1i are diagrams of layer film changes during a preparation of a substrate with a preparation method provided in embodiments of the present disclosure.

DETAILED DESCRIPTION

Hereinafter, the technical solutions in the embodiments of the present disclosure will be described clearly and comprehensively in combination with the accompanying drawings in the embodiments. Apparently, the embodiments described are only some of the embodiments of the present disclosure, rather than all of the embodiments.

Figure 1A:
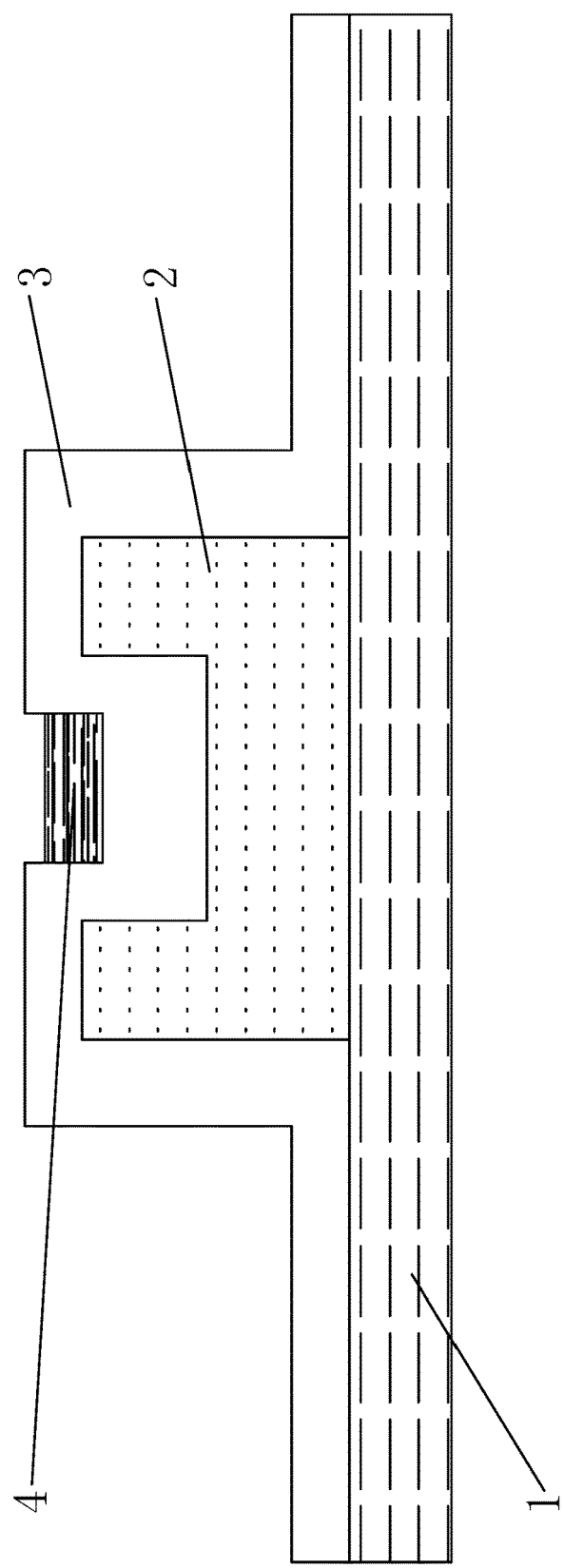

Please refer to FIG. 1a, which shows an array substrate provided in the present disclosure. The array substrate comprises a base substrate 1 and a plurality of thin film transistors distributed on the base substrate 1 in an array. Each thin film transistor comprises: a light-shielding block 2 formed on the base substrate 1 and provided with a first groove of which an opening direction is away from the base substrate 1; a buffer layer 3 formed on one side of the light-shielding block away from the base substrate 1, a region of the buffer layer 3 corresponding to the first groove being disposed with a second groove of which an opening direction is away from the base substrate 1; and a channel layer 4 formed in the second groove.

The present disclosure provides an array substrate. The array substrate comprises a base substrate 1 and a plurality of thin film transistors distributed on the base substrate 1 in an array. In each thin film transistor, a light-shielding block 2 is formed on the base substrate 1, and the light-shielding block 2 is provided with a first groove of which an opening direction is away from the base substrate 1. A buffer layer 3 for covering the light-shielding block is formed on one side of the light-shielding block away from the base substrate 1. A second groove of which an opening direction is away from the base substrate 1 is formed at the position of the buffer layer 3 corresponding to the first groove, A channel layer 4 is formed in the second groove of the buffer layer 3. The light-shielding block with the grooves may prevent the light rays reflected by metal patterns around the TFT from irradiating the channel layer in the TFT, and thus the stability of the TFT is improved.

In some embodiments, in the array substrate shown in FIG. 2a, a preparation material for the light-shielding block 2 is a metal material. The metal material is a material with high light-shielding performance. The light-shielding block 2 made of the metal material similarly with grooves may also prevent the channel layer 4 from being irradiated by light rays very well.

In some embodiments, since the buffer layer 3 is disposed between a metal structure (for example, the light-shielding block made of the metal material) below the TFT and the channel layer 4 in the TFT, the metal structure may also play a role of a gate electrode to affect the channel layer 4, and may further affect the normal operation of the TFT. This phenomenon is called as double-TFT effect. In order to avoid the double-TFT effect, the light-shielding block 2 may be made of a nonmetal material. In some embodiments, the nonmetal material may comprise a light-shielding photoresist, such that the light-shielding block may be conveniently formed by a gray scale mask process.

In some embodiments, the light-shielding block 2 in the array substrate shown in FIG. 1a may be made of a black matrix material. The black matrix material is a nonmetal material with high light-shielding performance, which may well avoid the channel layer 4 from being irradiated by light rays.

Figure 1B:
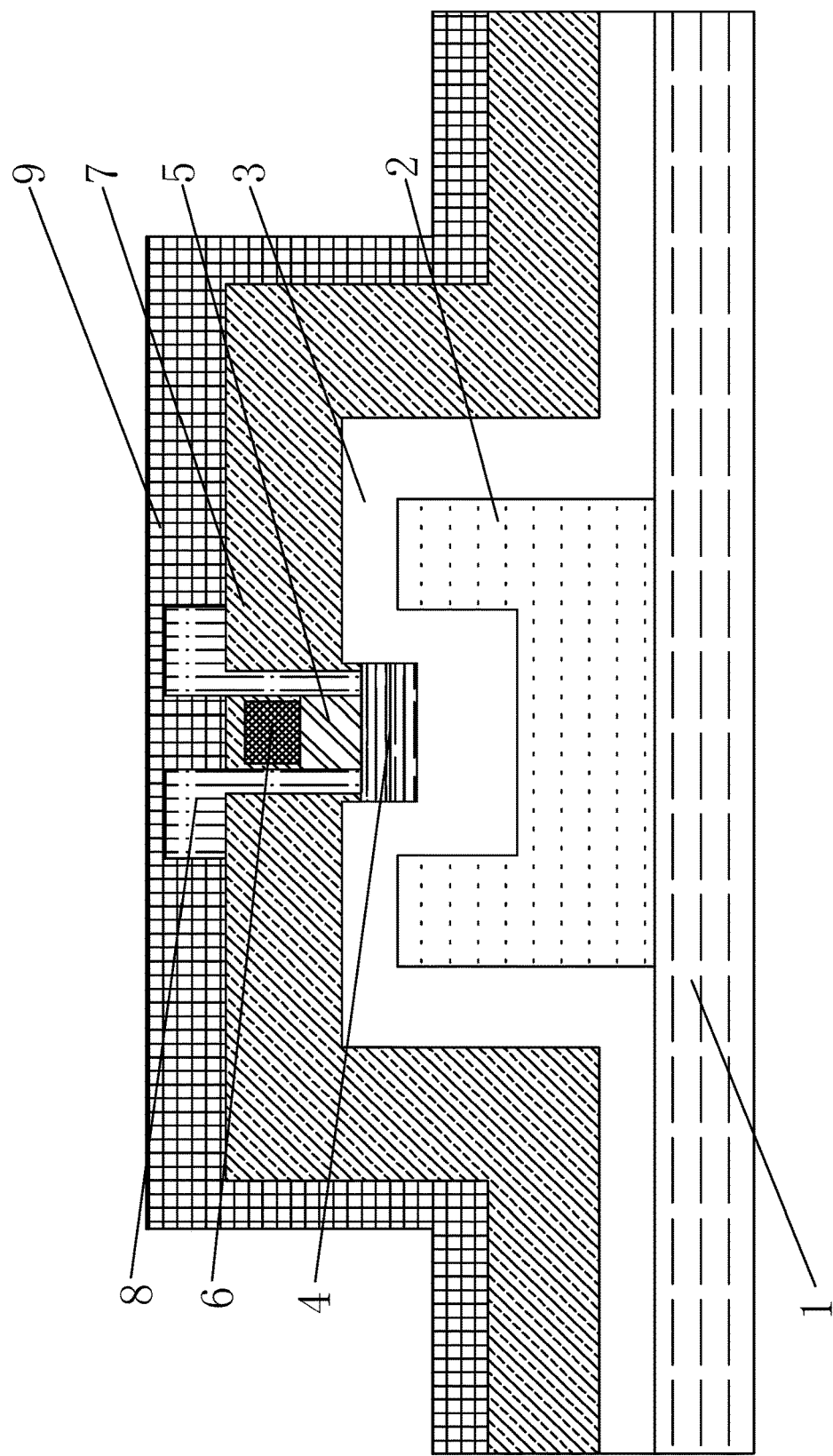

In some embodiments, as shown in FIG. 1b, the array substrate further comprises: a gate insulating layer 5 formed on one side of the channel layer 4 away from the base substrate 1; a gate electrode 6 formed on one side of the gate insulating layer 5 away from the base substrate 1; an interlayer insulating layer 7 formed on one side of the gate electrode 6 away from the base substrate 1; a source-drain electrode 8 formed on one side of the interlayer insulating layer 7 away from the base substrate 1, the source-drain electrode 8 being connected to the channel layer 4 by via holes; and a passivation layer 9 formed on one side of the source-drain electrode 8 away from the base substrate 1.

The present disclosure provides an array substrate. The above array substrate comprises a base substrate 1 and a plurality of thin film transistors distributed on the base substrate 1 in an array. In each thin film transistor, a light-shielding block 2 is formed on the base substrate 1, and the light-shielding block 2 is provided with a first groove of which an opening direction is away from the base substrate 1. A buffer layer 3 for covering the light-shielding block is formed on one side of the light-shielding block away from the base substrate 1. A second groove of which an opening direction is away from the base substrate 1 is formed at a position of the buffer layer 3 corresponding to the first groove. A channel layer 4 is formed in the second groove of the buffer layer 3. Since the light-shielding block 2 is made of the nonmetal material, the light-shielding block 2 does not affect the channel layer 4, and thus the double-TFT effect does not arise. In addition, the above structure uses bulges on two sides of the first groove to shield the light rays in regions without the thin film transistor, thereby improving the stability of the thin film transistor.

In addition, a gate insulating layer 5 is formed on one side of the channel layer 4 away from the base substrate 1. A gate electrode 6 is formed on one side of the gate insulating layer 5 away from the base substrate 1. An interlayer insulating layer 7 is formed on one side of the gate electrode 6 away from the base substrate 1. A source-drain electrode 8 is formed on one side of the interlayer insulating layer 7 away from the base substrate 1. The source-drain electrode 8 is connected to the channel layer 4 by via holes. A passivation layer 9 is formed on one side of the source-drain electrode 8 away from the base substrate 1. From the above structures, it can be known that the above array substrate makes full use of the existing pattern layers, for example, the interlayer insulating layer 7, the gate electrode 6, the source-drain electrode 8, the passivation layer 9, etc., without changing the structures of the above pattern layers excessively. With the structure, the array substrate provided in the present disclosure is convenient to produce and manufacture, and the array substrate has a high practicability.

Therefore, the above array substrate is disposed with a light-shielding body to shield the light reflected by other regions without the thin film transistor, which is favorable to improve the stability of the thin film transistor. Optionally, based on the above technical solution, a preparation material for the buffer layer 3 is silicon oxide; and/or a preparation material for the channel layer 4 is In—Ga—Zn oxide; and/or a preparation material for the gate insulating layer 5 is silicon oxide; and/or a preparation material for the gate electrode 6 is Cu or Al; and/or a preparation material for the interlayer insulating layer 7 is silicon oxide; and/or a preparation material for the source-drain electrode 8 is Cu or Al; and/or a preparation material for the passivation layer 9 is silicon oxide.

In some embodiments, based on the above technical solution, the depth of the first groove is 0.5-0.7 micrometer. The thickness of the buffer layer 3 is 0.3-0.5 micrometer. The thickness of the channel layer 4 is 0.05-0.09 micrometer. Along the extending direction of the base substrate I, the width of the first groove is larger than the width of the channel layer 4 by 3-5 micrometers.

It should be noted that with the above sizes, the bulges on two ends of the first groove may better play the light-shielding function for the channel layer 4 in the second groove corresponding to the first groove, thereby better avoiding the light rays from the regions without the thin film transistor from irradiating the channel layer 4. Thus, the stability of the thin film transistor is improved.

In some embodiments, the thickness of the gate insulating layer 5 is 0.1-0.2 micrometer; the thickness of the gate electrode 6 is 0.5-0.7 micrometer; the thickness of the interlayer insulating layer 7 is 0.3-0.5 micrometer; and the thickness of the source-drain electrode 8 is 0.5-0.7 micrometer.

Figure 2:
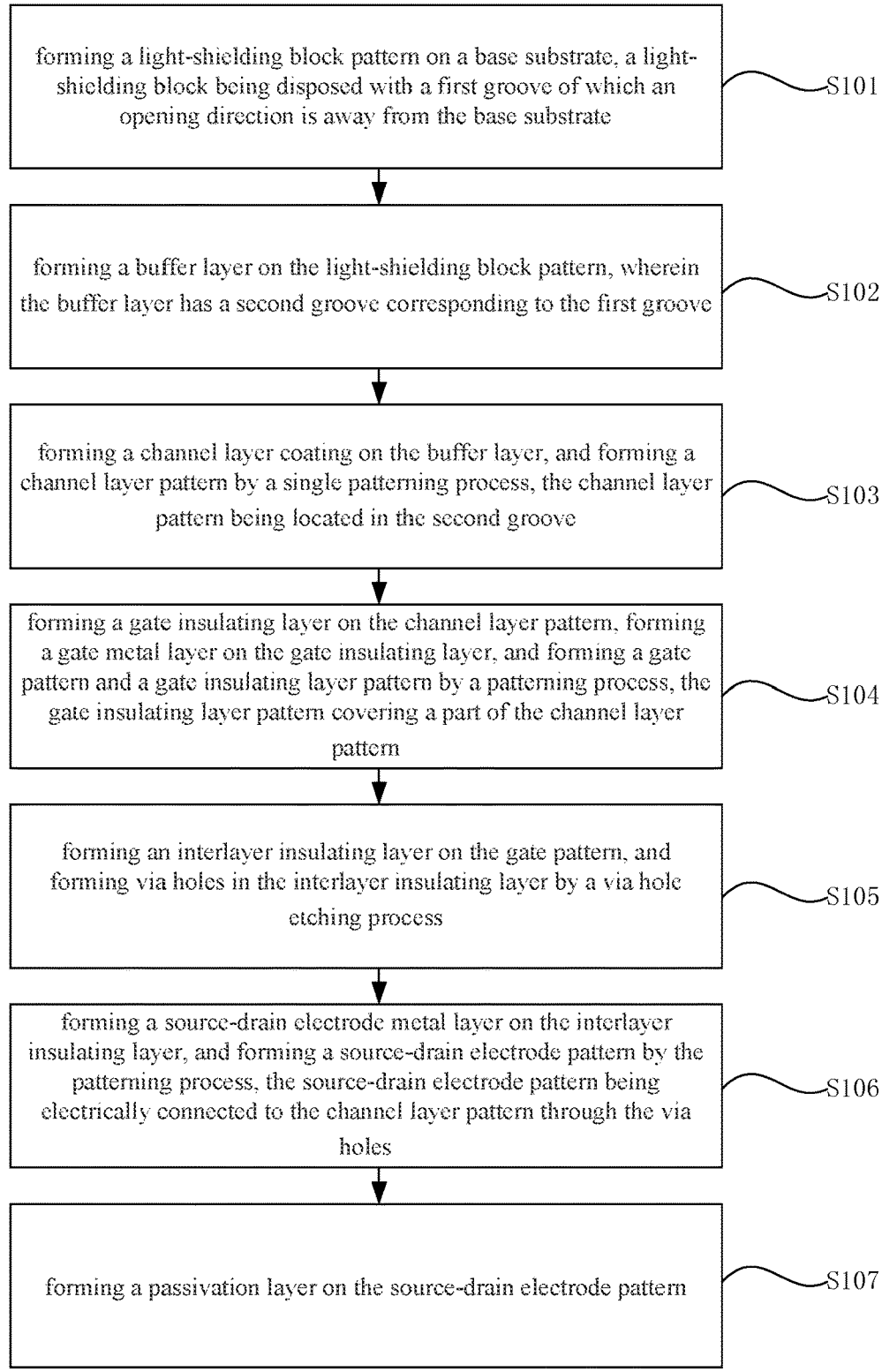
FIG. 2 is a flow chart of a preparation method for an array substrate provided in embodiments of the present disclosure.

FIG. 2 shows a flow chart of a preparation method for an array substrate provided in embodiments of the present disclosure. As shown in FIG. 2, there further provides a preparation material for an array substrate, which may be used to prepare the array substrate in any of the above technical solutions. The method comprises the following steps.

In step S101, as shown in FIG. 2 and also referring to FIG. 1*c*, a light-shielding block pattern 2 is formed on a base substrate 1. A light-shielding block is disposed with a first groove of which an opening direction is away from the base substrate 1.

In step S101, a shielding layer may be first formed on the base substrate, and then the shielding layer may be processed through a patterning process to be the light-shielding block pattern 2.

In the embodiments of the present disclosure, the reference numeral 2 in the drawings may refer to the light-shielding block pattern, and may also refer to certain one light-shielding block in the light-shielding block pattern.

In step S102, as shown in FIG. 2 and also referring to FIG. 1*d*, a buffer layer 3 is formed on the light-shielding block pattern 2, wherein the buffer layer 3 has a second groove corresponding to the first groove.

In step S103, as shown in FIG. 2 and also referring to FIG. 1*e*, a channel layer 4 coating is formed on the buffer layer 3, and a channel layer pattern 4 is formed by a single patterning process. The channel layer pattern 4 is located in the second groove.

The patterning process may comprise the procedures such as photoresist coating, photoresist exposure, developing, etching and photoresist peeling. These procedures may refer to related technologies and are not repeated here.

In the embodiment of the present disclosure, the reference numeral 4 in the drawings may refer to the channel layer pattern, and may also refer to certain one channel layer in the channel layer pattern.

Figure 1F:
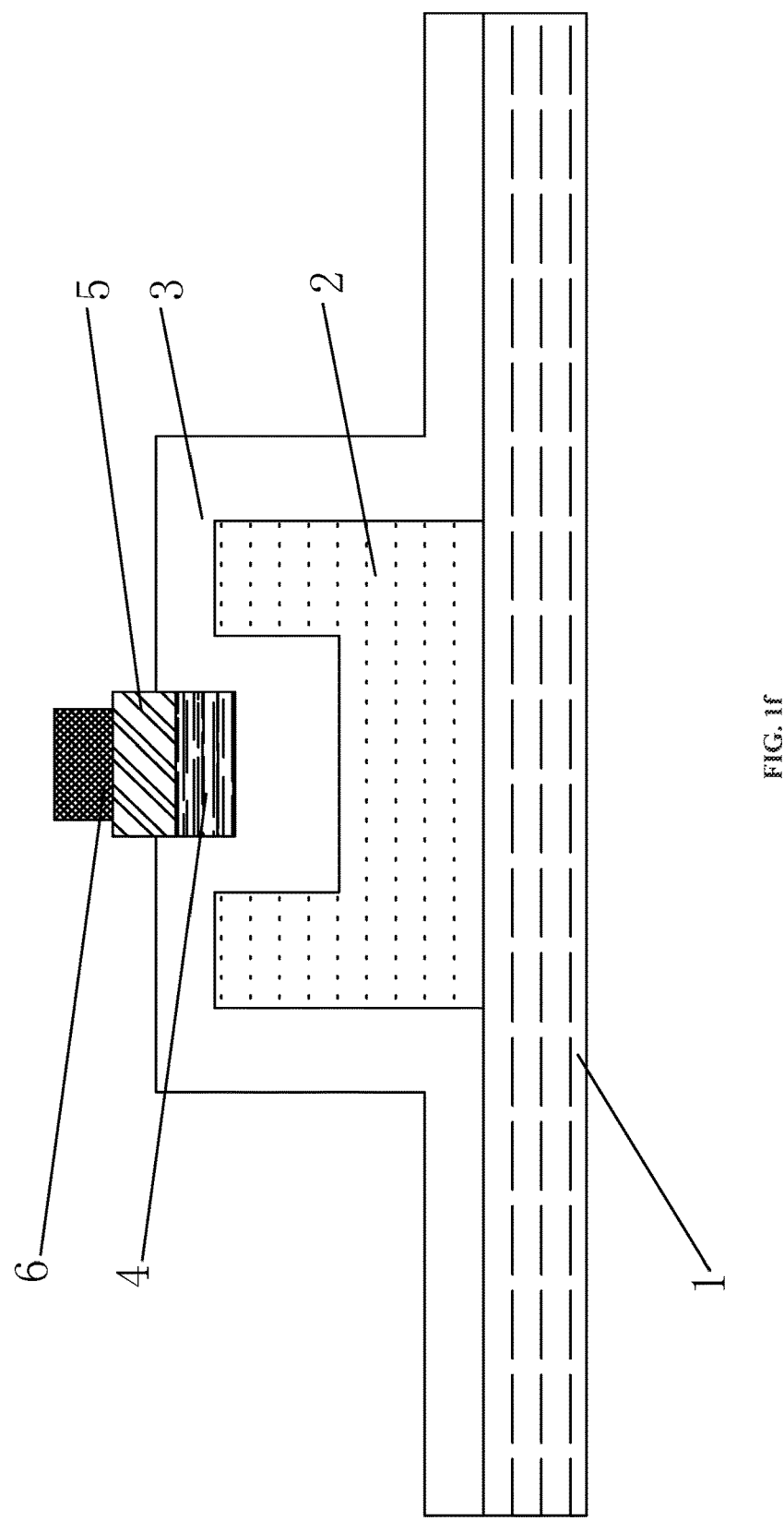
Figure 19:
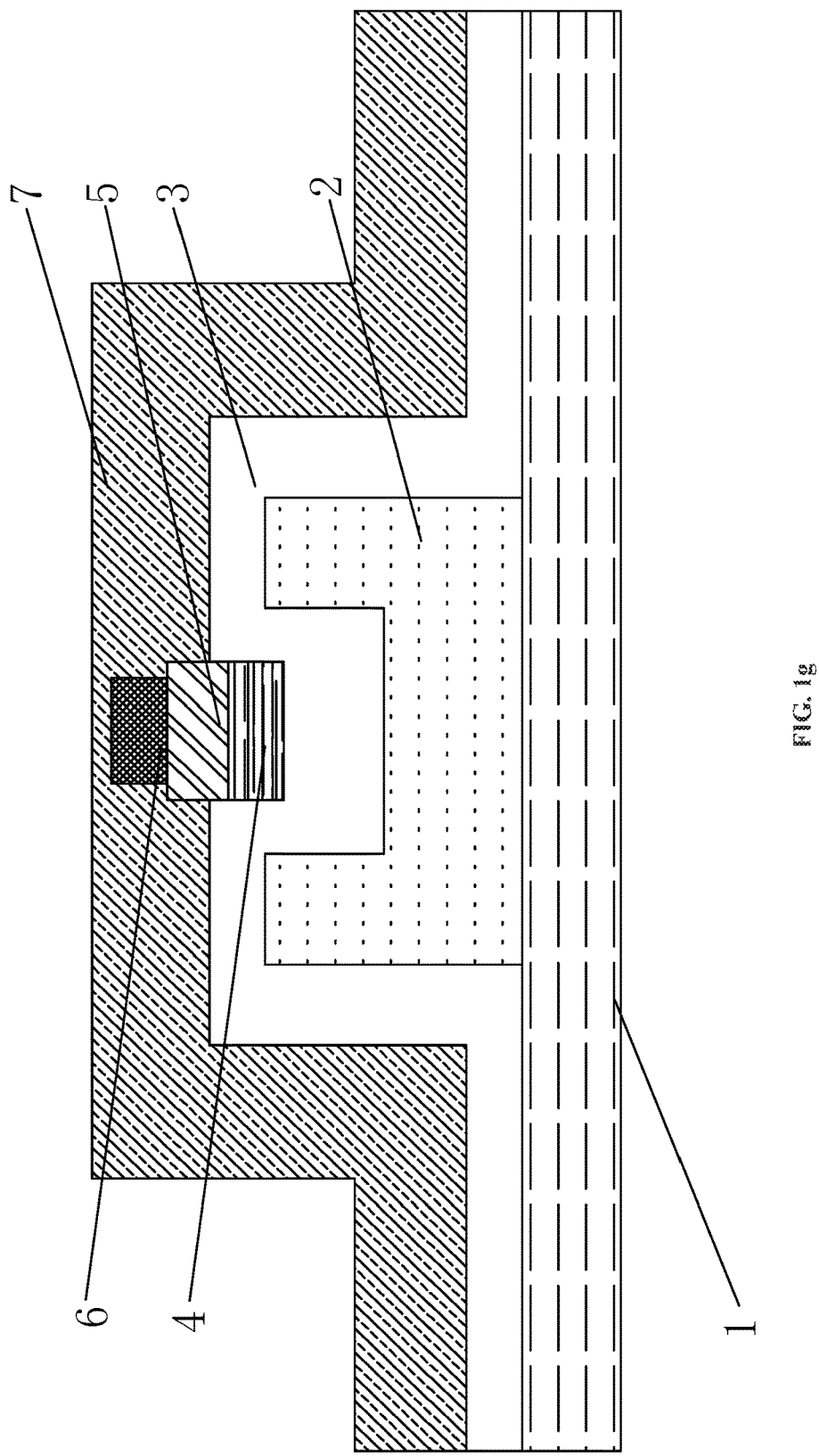
Figure 9:
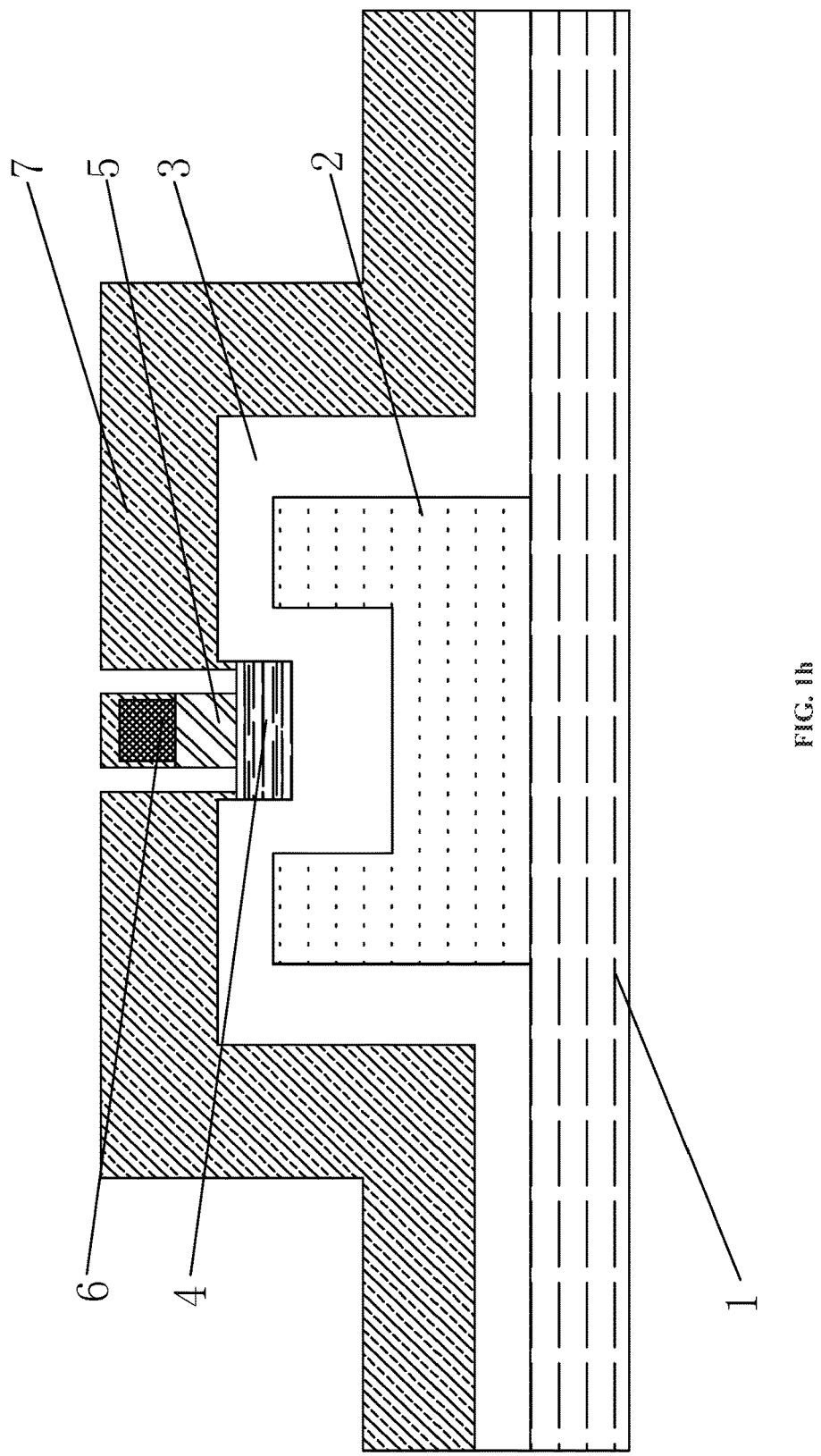
Figure 11:
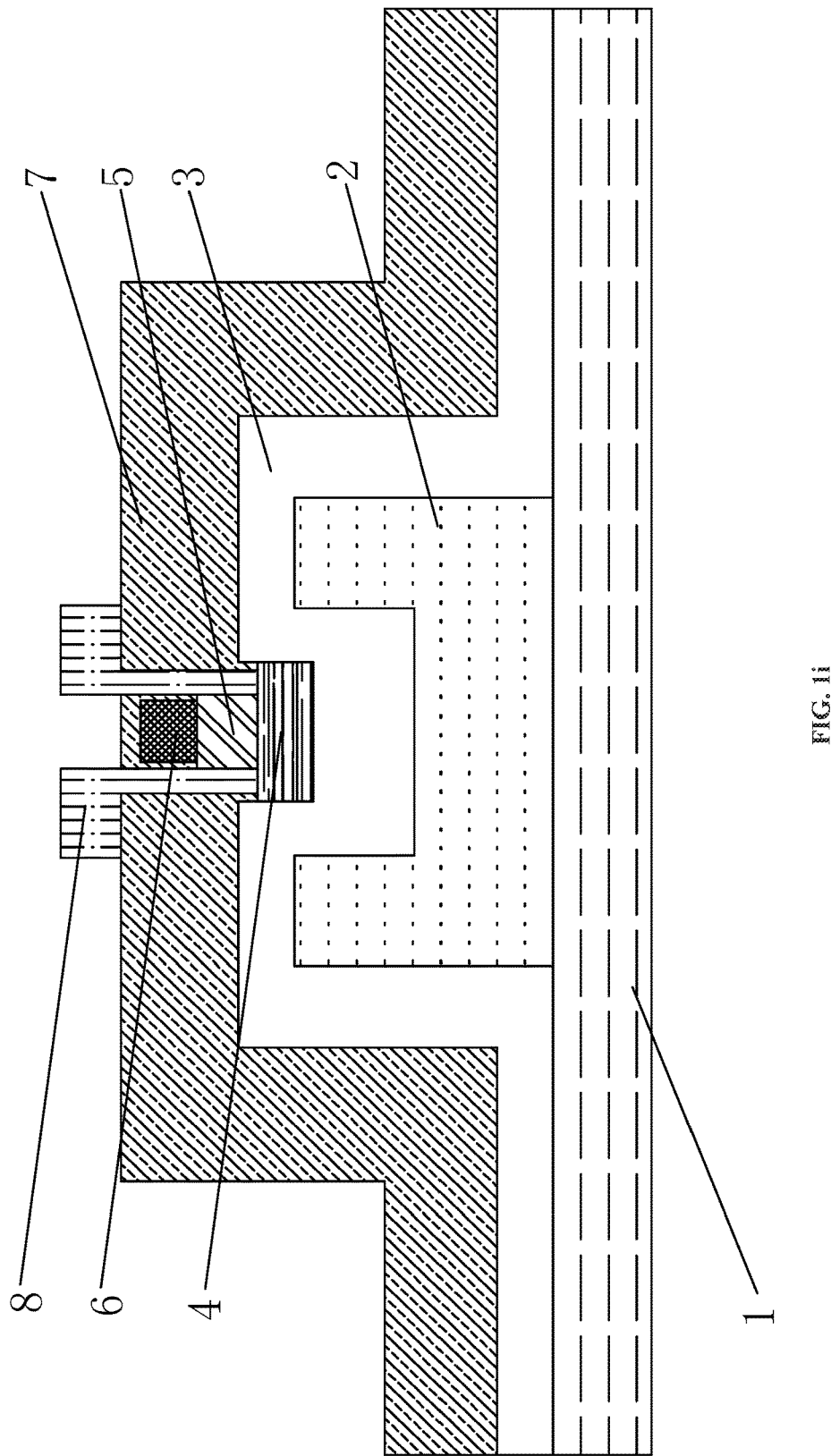

In step S104, also referring to FIGS. 1*e* and 1*f*, a gate insulating layer 5 is formed on the channel layer pattern 4. A gate metal layer is formed on the gate insulating layer 5. A gate pattern 6 and a gate insulating layer pattern 5 are formed by the patterning process, and the gate insulating layer pattern 5 covers a part of the channel layer pattern 4.

In the embodiment of the present disclosure, the reference numeral 6 in the drawings may refer to the gate pattern, and may also refer to certain one gate electrode in the gate pattern. The reference numeral 5 in the drawings may refer to the gate insulating layer pattern and may also refer to certain one gate insulating layer in the gate insulating layer pattern.

In step S105: also referring to FIGS. 1*g* and 1*h*, an interlayer insulating layer 7 is formed on the gate pattern 6. Via holes are formed in the interlayer insulating layer 7 by a via hole etching process.

In step S106: also referring to FIG. 1*i*, a source-drain electrode metal layer is formed on the interlayer insulating layer 7. A source-drain electrode pattern 8 is formed by the patterning process, and the source-drain electrode pattern 8 is electrically connected to the channel layer pattern 4 by the via holes.

In the embodiment of the present disclosure, the reference numeral 8 in the drawings may refer to the source-drain electrode pattern, and may also refer to certain one source-drain electrode in the source-drain electrode pattern.

In step S107, also referring to FIG. 1*b*, a passivation layer 9 is formed on the source-drain electrode pattern 8.

In the above preparation method for an array substrate, the shielding layer is formed on the base substrate 1, and the light-shielding block pattern 2 is formed by a semitransparent patterning process. Here, the light-shielding block 2 is made of the nonmetal material. The light-shielding block is disposed with a first groove of which an opening direction is away from the base substrate 1. The buffer layer 3 is formed on the light-shielding block pattern 2. Here, the buffer layer 3 has a second groove corresponding to the first groove. The channel layer 4 coating is formed on the buffer layer 3, and the channel layer pattern 4 is formed by a single patterning process. The channel layer pattern 4 is in the second groove. In the above structure, the protruded thicknesses of the bulges on two sides of the first groove are used to shield the light rays reflected by the regions without the thin film transistor. Thus, the stability of the thin film transistor may be improved.

In some embodiments, based on the above technical solution, the light-shielding block is made of a light-shielding photoresist. Forming the light-shielding block pattern on a base substrate comprises:

Forming the light-shielding block pattern on the base substrate by a gray scale mask process.

The gray scale mask process may comprise: forming a light-shielding layer made of the light-shielding photoresist on the base substrate, exposing the light-shielding layer with the gray scale mask as a mask and processing the light-shielding layer by a developing process to obtain the light-shielding block pattern. Here, the gray scale mask may comprise regions of different transmittances. When the light-shielding block is made of the photoresist, with the gray scale mask as the mask, the light-shielding block pattern with the first groove may be formed by exposure and developing once. Thus, the procedure steps for forming the light-shielding block pattern is reduced.

In addition, the gate insulating layer 5 is formed on the channel layer pattern 4. The gate metal layer 6 is formed on the gate insulating layer 5. The gate pattern 6 and the gate insulating layer pattern 5 are formed by the patterning process. The gate insulating layer pattern 5 covers a part of the channel layer pattern 4. The interlayer insulating layer 7 is formed on the gate pattern 6. The via holes are formed in the interlayer insulating layer 7 by the via hole etching process. The source-drain electrode 8 metal layer is formed on the interlayer insulating layer 7, and the source-drain electrode pattern 8 is formed by the patterning process. The source-drain electrode pattern 8 is electrically connected to the channel layer pattern 4 by the via holes. The passivation layer 9 is formed on the source-drain electrode pattern 8. From the above, it can be known that the preparation method for an array substrate provided in the present disclosure makes full use of the existing preparing processes for the patterns, without changing the structures of above pattern layers excessively. With the structure, the preparation method for an array substrate provided in the present disclosure has a high practicability.

In some embodiments, based on the above technical solution, the patterning process adopted for the gate metal layer 6 and the gate insulating layer 5 comprises:

forming a photoresist layer on the gate metal layer;

exposing the photoresist layer to form a gate mask photoresist on the gate metal layer;

performing wet etching on the gate metal layer with the gate mask photoresist as a mask, to form the gate electrode pattern 6;

performing dry etching on the gate insulating layer 5 with the gate mask photoresist being reserved, to form the gate insulating layer pattern 5; and peeling off the gate mask photoresist by adopting a peeling process.

Based on the above technical solution, the peeling process comprises a wet peeling method for peeling.

Based on the above technical solution, the via hole etching process comprises dry etching for etching.

In some embodiments, based on the above technical solution, the preparation material for the light-shielding block is a metal material. Forming a light-shielding block pattern on a base substrate comprises:

forming the shielding block pattern on the base substrate by a patterning process.

When the preparation material for the light-shielding block is a metal material, since the metal material is relatively hard to process, the light-shielding block pattern with the first groove may be formed on the base substrate by multiple patterning processes.

The present disclosure further provides a display panel comprising the array substrate in any of the above technical solutions.

In some embodiments, the display panel is an organic electroluminescence diode display panel.

The present disclosure further provides a display device, comprising the display panel above.

Apparently, a person of ordinary skill in the art may make various changes and modifications to the embodiments of the present disclosure. The present disclosure is intended to include these changes and modifications if the changes and modifications fall within the scope of the claims of the present disclosure and the equivalent technical scope thereof.

What is claimed is:

1. An array substrate, comprising a base substrate and a plurality of thin film transistors distributed on the base substrate in an array, wherein each thin film transistor comprises:
    a light-shielding block formed on the base substrate and provided with a first groove of which an opening direction is away from the base substrate;
    a buffer layer formed on one side of the light-shielding block away from the base substrate, a region of the buffer layer corresponding to the first groove being disposed with a second groove of which an opening direction is away from the base substrate; and
    a channel layer formed in the second groove.

2. The array substrate according to claim 1, wherein the light-shielding block is made of a nonmetal material.

3. The array substrate according to claim 2, wherein the nonmetal material comprises a light-shielding photoresist.

4. The array substrate according to claim 3, wherein a preparation material for the light-shielding block is a black matrix material.

5. The array substrate according to claim 1, wherein preparation materials for the array substrate meet at least one of the followings:
    the preparation material for the buffer layer is silicon oxide; and
    the preparation material for the channel layer is an In—Ga—Zn oxide.

6. The array substrate according to claim 1, wherein the array substrate further comprises:
    a gate insulating layer formed on one side of the channel layer away from the base substrate;
    a gate electrode formed on one side of the gate insulating layer away from the base substrate;
    an interlayer insulating layer formed on one side of the gate electrode away from the base substrate;
    a source-drain electrode formed on one side of the interlayer insulating layer away from the base substrate, the source-drain electrode being connected to the channel layer by via holes; and
    a passivation layer formed on one side of the source-drain electrode away from the base substrate.

7. The array substrate according to claim 6, wherein preparation materials for the array substrate meet at least one of the followings:
    the preparation material for the gate insulating layer is silicon oxide;
    the preparation material for the gate electrode is Cu or Al;

the preparation material for the interlayer insulating layer is silicon oxide;

the preparation material for the source-drain electrode is Cu or Al; and the preparation material for the passivation layer is silicon oxide.

8. The array substrate according to claim 1, wherein a depth of the first groove is 0.5-0.7 micrometer, a thickness of the buffer layer is 0.3-0.5 micrometer, a thickness of the channel layer is 0.05-0.09 micrometer; and along an extending direction of the base substrate, a width of the first groove is larger than that of the channel layer by 3-5 micrometers.

9. The array substrate according to claim 7, wherein a thickness of the gate insulating layer is 0.1-0.2 micrometer;

a thickness of the gate electrode is 0.5-0.7 micrometer;

a thickness of the interlayer insulating layer is 0.3-0.5 micrometer; and a thickness of the source-drain electrode is 0.5-0.7 micrometer.

10. The array substrate according to claim 1, wherein a preparation material for the light-shielding block is a metal material.

11. A method for preparing the array substrate of claim 1, comprising:

forming a light-shielding block pattern on a base substrate, a light-shielding block in the light-shielding block pattern being disposed with a first groove of which an opening direction is away from the base substrate;

forming a buffer layer on the light-shielding block pattern, wherein the buffer layer has a second groove corresponding to the first groove; and forming a channel layer coating on the buffer layer, and forming a channel layer pattern by a single patterning process, the channel layer pattern being located in the second groove.

12. The method according to claim 11, wherein the light-shielding block is formed by light-shielding photoresist, and forming the light-shielding block pattern on the base substrate comprises:

forming the light-shielding block pattern on the base substrate by a gray scale mask process.

13. The method according to claim 11, after forming the channel layer coating on the buffer layer, further comprising:

forming a gate insulating layer on the channel layer pattern, forming a gate metal layer on the gate insulating layer, and forming a gate pattern and a gate insulating layer pattern by a patterning process, the gate insulating layer pattern covering a part of the channel layer pattern;

forming an interlayer insulating layer on the gate pattern, and forming via holes in the interlayer insulating layer by a via hole etching process;

forming a source-drain electrode metal layer on the interlayer insulating layer, and forming a source-drain electrode pattern by the patterning process, the source-drain electrode pattern being electrically connected to the channel layer pattern through the via holes; and forming a passivation layer on the source-drain electrode pattern.

14. The method according to claim 13, wherein the patterning process adopted for the gate metal layer and the gate insulating layer comprises:

forming gate mask photoresist on the gate metal layer;

performing wet etching on the gate metal layer with the gate mask photoresist as a mask, to form the gate pattern;

reserving the gate mask photoresist to perform dry etching on the gate insulating layer, to form the gate insulating layer pattern; and peeling the gate mask photoresist by adopting a peeling process.

15. The method according to claim 14, wherein the peeling process comprises a wet peeling method for peeling.

16. The method according to claim 13, wherein the via hole etching process comprises dry etching for etching.

17. The method according to claim 11, wherein a preparation material for the light-shielding block is a metal material, and forming the light-shielding block pattern on the base substrate comprises:

forming the light-shielding block pattern on the base substrate by adopting a patterning process.

18. A display panel, comprising an array substrate which comprises:

a base substrate and a plurality of thin film transistors distributed on the base substrate in an array, wherein each thin film transistor comprises:

a light-shielding block formed on the base substrate, the light-shielding block being disposed with a first groove of which an opening direction is away from the base substrate;

a buffer layer formed on one side of the light-shielding block away from the base substrate, a region of the buffer layer corresponding to the first groove being disposed with a second groove of which an opening direction is away from the base substrate; and a channel layer formed in the second groove.

19. The display panel according to claim 18, wherein the display panel is an organic electroluminescence diode display panel.

20. A display device, comprising the display panel according to claim 19.

* * * * *